US009001512B2

(12) United States Patent
Smith et al.

(10) Patent No.: US 9,001,512 B2
(45) Date of Patent: Apr. 7, 2015

(54) HEAT SPREADER FOR ELECTRICAL COMPONENTS

(75) Inventors: Clark L. Smith, Columbus, NE (US);
Todd L. Wyatt, Columbus, NE (US);
Thomas L. Veik, Columbus, NE (US)

(73) Assignee: Vishay Dale Electronics, Inc.,
Columbus, NE (US)

( * ) Notice: Subject to any disclaimer, the term of this patent is extended or adjusted under 35 U.S.C. 154(b) by 81 days.

(21) Appl. No.: 13/462,958

(22) Filed: May 3, 2012

(65) Prior Publication Data
US 2012/0281363 A1 Nov. 8, 2012

Related U.S. Application Data

(60) Provisional application No. 61/482,014, filed on May 3, 2011.

(51) Int. Cl.
| | |
|---|---|
| H05K 7/20 | (2006.01) |
| F28F 13/00 | (2006.01) |
| H01C 1/084 | (2006.01) |
| H01C 1/14 | (2006.01) |

(52) U.S. Cl.
CPC ............... *F28F 13/00* (2013.01); *H01C 1/084* (2013.01); *H01C 1/14* (2013.01); *H01L 2924/0002* (2013.01)

(58) Field of Classification Search
USPC ........... 361/676–678, 679.46–679.54, 361/688–722, 752, 760–762, 772, 831
See application file for complete search history.

(56) References Cited

U.S. PATENT DOCUMENTS

| | | | |
|---|---|---|---|
| 3,795,046 A | 3/1974 | Shirn | |
| 4,159,459 A | 6/1979 | Sease et al. | |
| 5,481,241 A * | 1/1996 | Caddock, Jr. | 338/51 |
| 5,604,477 A | 2/1997 | Rainer et al. | |
| 6,195,256 B1 * | 2/2001 | Tiziani et al. | 361/704 |
| 7,119,447 B2 | 10/2006 | Larking | |
| 7,190,068 B2 | 3/2007 | Hackitt et al. | |
| 7,671,455 B2 | 3/2010 | Pavier | |
| 7,843,309 B2 | 11/2010 | Zandman et al. | |
| 2003/0052386 A1 * | 3/2003 | Yamaguchi | 257/536 |
| 2003/0116552 A1 * | 6/2003 | Santoruvo et al. | 219/209 |
| 2006/0197648 A1 * | 9/2006 | Smith et al. | 338/309 |
| 2006/0231945 A1 | 10/2006 | Chinthakindi et al. | 257/712 |
| 2007/0108388 A1 * | 5/2007 | Lane et al. | 250/353 |
| 2007/0120060 A1 * | 5/2007 | Lane et al. | 250/353 |
| 2007/0262845 A1 | 11/2007 | Takagi et al. | |
| 2008/0102584 A1 * | 5/2008 | Kerr et al. | 438/275 |
| 2008/0310167 A1 | 12/2008 | Zaderej et al. | |
| 2009/0154111 A1 | 6/2009 | Lynch | |
| 2010/0328021 A1 | 12/2010 | Hirasawa et al. | |
| 2011/0063071 A1 * | 3/2011 | Zandman et al. | 338/275 |

FOREIGN PATENT DOCUMENTS

| | | |
|---|---|---|
| EP | 0 324 890 A1 | 7/1989 |
| JP | 2009-038275 A | 2/2009 |

OTHER PUBLICATIONS

Frank, Randy "Innovations Accelerate Automotive Change" Electronic Design magazine, p. 71 with web page of same article, 2 pages (www.electronicdesign.com) with published date of Dec. 9, 2010.

* cited by examiner

*Primary Examiner* — Courtney Smith
(74) *Attorney, Agent, or Firm* — Volpe and Koenig, P.C.

(57) ABSTRACT

A heat spreader for a resistive element is provided, the heat spreader having a body portion that is arranged over a top surface of the resistive element and electrically insulated from the resistive element. The heat spreader also includes one or more leg portion that extends from the body portion and are associated with the heat sink in a thermally conductive relationship.

19 Claims, 11 Drawing Sheets

HEAT SPREADER FOR ELECTRICAL COMPONENTS

FIELD OF INVENTION

This application is generally related to heat spreaders for electrical components and in more particular relates to heat spreaders for resistive elements mounted to heat sinks.

BACKGROUND

Electrical components generate heat during normal operation, which must be continuously dissipated to ensure proper operation. Excessive heat can negatively affect the performance of an electrical system, as component parameter values generally vary with temperature. At particularly high temperatures, components may no longer perform within specification and may experience failure. This is especially true of resistive elements, which are used in numerous electronic systems and devices. As these systems and devices continue to decrease in size, the dimensions of their electrical components must also decrease accordingly. While the physical size of electric systems and their components have gotten smaller, the power requirements of these systems, and the heat generated therefrom, have not necessarily reduced in magnitude. Therefore, the heat generated by the components must be carefully managed in order to maintain safe and reliable operating temperatures for the systems.

Resistive elements can have many different configurations. Some of these configurations lack efficient heat dissipation capabilities. While resistive elements can be mounted to heat sinks so that heat is dissipated through conduction at the points of thermal contact between the resistive element and the heat sink, this does not always provide sufficient heat dissipation. During operation, typical resistors can develop hot spots in the center of the resistive element (e.g., away from the heat sinking benefits of the electrical leads). Overheated resistive material is susceptible to changes in resistivity, resulting in a resistor that shifts out of tolerance over its life, or during periods of power overloading. This problem is particularly acute in high-current or pulsed applications employing very small components. Some resistor configurations are limited to resistors with larger form factors. As the size of the resistor decreases, it becomes increasingly difficult to provide adequate heat dissipation capabilities. These heat dissipation concerns also pertain to other small form electrical components, such as inductors, capacitors, semiconductor dies, and microprocessors.

Therefore, it is desirable to provide electrical components such as resistive elements with enhanced heat dissipation capabilities. It is also desirable to provide electrical components with enhanced heat dissipation means that are suitable for small form factors and can be incorporated into existing systems. It is also desirable to provide electrical components with enhanced heat dissipation means that are economical in manufacture, durable in use, and efficient in operation.

SUMMARY

A heat spreader for a resistive element mounted on a heat sink is disclosed. The heat spreader includes a body portion that is arranged over a top surface of the resistive element and electrically insulated from the resistive element. The heat spreader also includes one or more leg portions that extend from the body portion and are associated with the heat sink in a thermally conductive relationship. The heat spreader may further include a thermal interface material sandwiched between the body portion and the top surface of the resistive element, the thermal interface material being electrically non-conductive. The thermal interface material may include an adhesive.

A resistor and heat spreader assembly is also disclosed. The assembly includes a heat sink, a resistive element mounted on the heat sink, and a heat spreader associated with the resistive element and the heat sink. The heat spreader has a body portion that is arranged over the resistive element and electrically insulated from the resistive element. The assembly further includes a first layer of thermal interface material arranged between the heat sink and a bottom surface of the resistive element, and a second layer of thermal interface material arranged between a top surface of the resistive element and the body portion of the heat spreader.

A method for dissipating heat from a resistive element is also disclosed. The method includes the steps of providing a resistive element, mounting the resistive element on a heat sink in a thermally conductive relationship, and providing a heat spreader having a body portion and at least one leg portion that extends from the body portion. A thermal interface material is dispensed on a top surface of the resistive element, the thermal interface material being thermally conductive and electrically non-conductive. The heat spreader is arranged over the resistive element so that the thermal interface material is sandwiched between the body portion of the heat spreader and the top surface of the resistive element. The leg portion(s) of the heat spreader are associated with the heat sink in a thermally conductive relationship.

For sake of brevity, this summary does not list all aspects of the present invention, which are described in further detail below.

BRIEF DESCRIPTION OF THE DRAWINGS

The foregoing summary, as well as the following detailed description of the preferred embodiments of the invention, will be better understood when read in conjunction with the appended drawings. For the purpose of illustrating the invention, there is shown in the drawings embodiments which are presently preferred. It should be understood, however, that the invention is not limited to the precise arrangements shown.

DETAILED DESCRIPTION OF THE PREFERRED EMBODIMENTS

Figure 1:
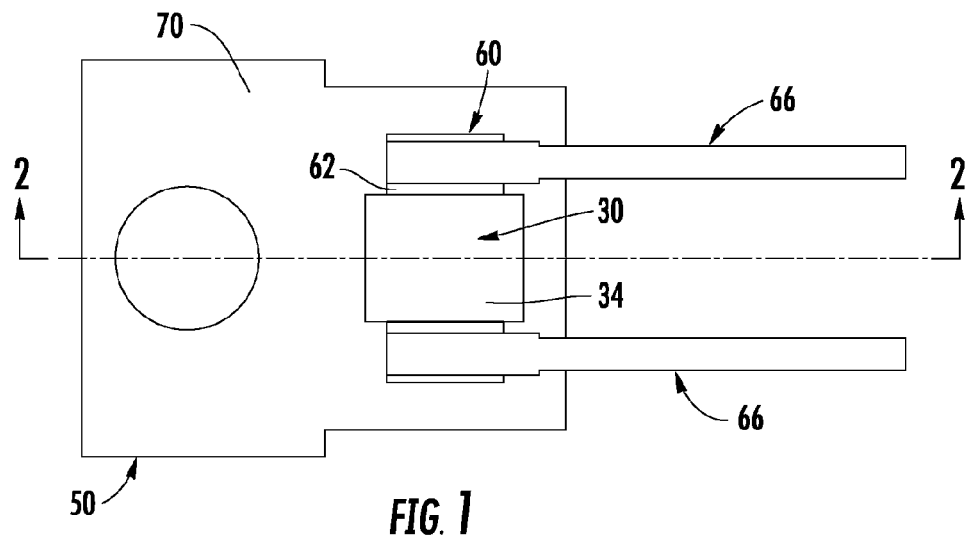
FIG. 1 is a top view of a first embodiment of the heat spreader mounted on a power package.

Certain terminology is used in the following description for convenience only and is not limiting. The words "top," "bottom," "upper," "lower," "inner," and "outer" designate directions in the drawings to which reference is made. The terminology includes the words specifically noted above, derivatives thereof, and words of similar import.

Figure 2:
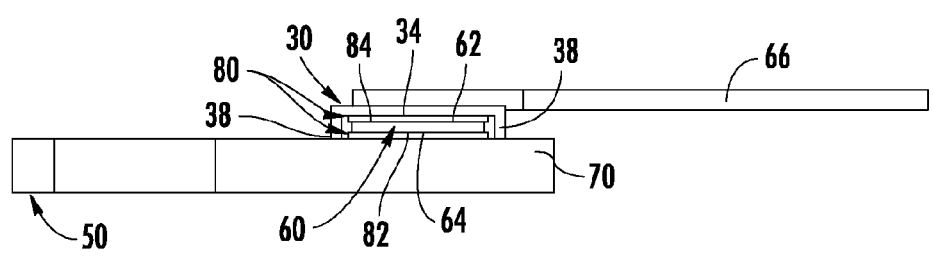
FIG. 2 is a sectional view taken along line 2-2 of FIG. 1.

FIGS. 1 and 2 show an embodiment of a heat spreader 30 according to the present application mounted on a power package 50. The power package 50 may include any surface mounted electrical component, such as, for example and without limitation, a resistor, inductor, capacitor, semiconductor die or microprocessor. U.S. Pat. No. 7,843,309 to Zandman et al. discloses an example of a power resistor. For illustrative purposes, the power package 50 shown in the figures may include a resistive element 60 mounted on a heat sink 70. The resistive element 60 may be mounted to the heat sink 70 by any appropriate means, preferably in a thermally conductive but electrically non-conductive manner so that heat from the resistive element 60 can be dissipated through the heat sink 70 without electrically shorting the resistive element 60.

The resistive element 60 may be, for example and without limitation, a film resistor, metal strip resistor, or wire-wound cylindrical resistor. To further dissipate heat from the resistive element 60, a heat spreader 30 is associated with the resistive element 60 and the heat sink 70.

The heat spreader 30 includes a body portion 34 that is arranged over a top surface 62 of the resistive element 60 and electrically insulated from the resistive element 60 so that the connection between the heat spreader 30, the resistive element 60, and the heat sink 70 does not short out the resistive element 60. The heat spreader 30 also includes at least one, but shown as two leg portions 38 that extend from the body portion 34 and are associated with the heat sink 70 in a thermally conductive relationship. The leg portions 38 are preferably formed integrally with the body portion 34 of the heat spreader 30. For example, the heat spreader 30 may be formed by bending a rectangular piece of material at opposing edges to form one or more leg portions 38. The leg portions 38 are arranged on opposite sides of the resistive element 60, and may be associated with the heat sink 70 by any suitable means that allows heat from the heat spreader 30 to be transferred to the heat sink 70. For example and without limitation, the leg portions 38 may be connected to the heat sink 70 through soldering, welding, brazing, mechanical fasteners, or thermally conductive adhesives. The heat spreader 30 may be formed from any material having the desired heat transfer characteristics, such as conductive metals. For example, the heat spreader 30 may be made from copper, which has relatively low cost, high thermal conductivity, and may be soldered to the heat sink 70.

To further secure the body portion 34 of the heat spreader 30 to the power package 50 while ensuring that the heat spreader 30 is electrically insulated from the resistive element 60, a thermal interface material 80 may be arranged between the body portion 34 of the heat spreader 30 and the top surface 62 of the resistive element 60. The thermal interface material 80 may also be arranged on the sides of the resistive element 60 to fill any space between the resistive element 60 and the leg portions 38 of the heat spreader 30. The thermal interface material 80 may be any suitable electrically non-conductive material that has the desired heat transfer properties. Preferably, the thermal interface material 80 includes an adhesive so that the body portion 34 of the heat spreader 30 is bonded to the resistive element 60. This maximizes the contact areas between the resistive element 60, the thermal interface material 80, and the heat spreader 30 to promote efficient heat dissipation, and strengthens the structural integrity of the assembly. As shown in FIG. 2, the assembly preferably includes a first layer 82 of thermal interface material 80 arranged between the heat sink 70 and a bottom surface 64 of the resistive element 60. If the thermal interface material 80 includes an adhesive, this first layer 82 of thermal interface material 80 may be used to mount the resistive element 60 to the heat sink 70.

When the thermal interface material 80 is the only element used to mount the resistive element 60 to the heat sink 70, the thermal interface material 80 must include a sufficiently strong adhesive, to revert the resistive element 60 from being from the heat sink 70 during overmolding of the assembly. A second layer 84 of thermal interface material 80 may be arranged between the top surface 62 of the resistive element 60 and the body portion 34 of the heat spreader 30 to provide a thermally conductive but electrically non-conductive connection between the resistive element 60 and the heat spreader 30.

In addition to an adhesive, the thermal interface material 80 may include solid particles having high thermal conductivity but low electrical conductivity. For example and without limitation, the thermal interface material 80 may comprise a polymer containing spherical alumina particles or boron nitride particles. The spherical alumina or boron nitride particles provide electrical insulation and heat dissipation between the resistive element 60 and the heat spreader 30, and also act as a spacer between the resistive element 60 and the heat spreader 30. The desired spacing may be achieved by adjusting the diameter of the spheres in the thermal interface material 80. Examples of commercially available adhesives that may be used as the thermal interface material 80 include Bergquist Liqui-Bond® SA 2000 and Caledon CCD-120A50.

As shown in FIGS. 1 and 2, a pair of electrical leads 66 may be connected to the top surface 62 of the resistive element 60 at opposite ends thereof, leaving an exposed area between the leads 66. In known surface mounted resistor packages, heat from the resistor is dissipated through convection from air flow over this exposed area on the top surface of the resistor. The present heat spreader 30 increases the amount of dissipation, as heat from the top surface 62 of the resistive element 60 can now be transferred through conduction to the body portion 34 of the heat spreader 30 and down the leg portions 38 into the heat sink 70. To maximize heat dissipation through the heat spreader 30, the body portion 34 of the heat spreader 30 preferably covers substantially all of the exposed area at the top surface 62 of the resistive element 60, as shown in FIG. 1.

In a power package 50 having the present heat spreader 30, approximately 80-90% of the heat from the top surface 62 of the resistive element 60 is dissipated through the leg portions 38 of the heat spreader 30 down into the heat sink 70, while approximately 10% of the heat is dissipated through convention from air flow over the body portion 34 of the heat spreader 30. Arranging the heat spreader 30 over the top surface 62 of the resistive element 60 also provides mechanical advantages, as power packages 50 having a resistive element 60 mounted to a heat sink 70 often undergo a molding operation during assembly as discussed below, and resistive elements 60 that are not adequately secured to the heat sink 70 may become separated during molding. The presence of the heat spreader 30 helps keep the resistive element 60 in place during the molding operation.

The heat spreader 30 and power package 50 assembly may optionally be overmolded using a suitable epoxy mold compound. One of ordinary skill in the art would understand that a variety of compounds and methods may be used for this overmolding operation, depending on the specific requirements and attributes of the assembly. For example and without limitation, a protective coating may be applied to the heat spreader 30 and power package 50 to cover the portions that will be overmolded. This protective coating acts to buffer the overmolded portions from the stresses caused by adhesion of the mold compound to the assembly. The heat spreader 30 and power package 50 assembly may then be placed into a mold cavity which is subsequently filled with an epoxy molding compound. The mold cavity may be formed such that the side of the heat sink 70 that does not include the resistive element 60 and heat spreader 30 is in contact with the mold cavity, so that it is not overmolded and thus remains exposed on a back side of the overmolded assembly. This provides a mating surface for mounting the heat sink 70 onto an external heat sink or chassis for heat transfer purposes.

An alternative option to overmolding is to coat the heat spreader 30 and resistive element 60 side of the heat sink 70 with a conformal coating, while leaving the other side of the heat sink 70 exposed for mating with an external heat sink or chassis. This operation yields a lower manufacturing cost, but provides less mechanical strength when compared to overmolding. After the heat spreader 30 and power package 50 assembly is molded, a defleshing operation may be carried out to remove any excess mold compound from the edges of the heat spreader 30, resistive element 60, and heat sink 70.

Figure 21:
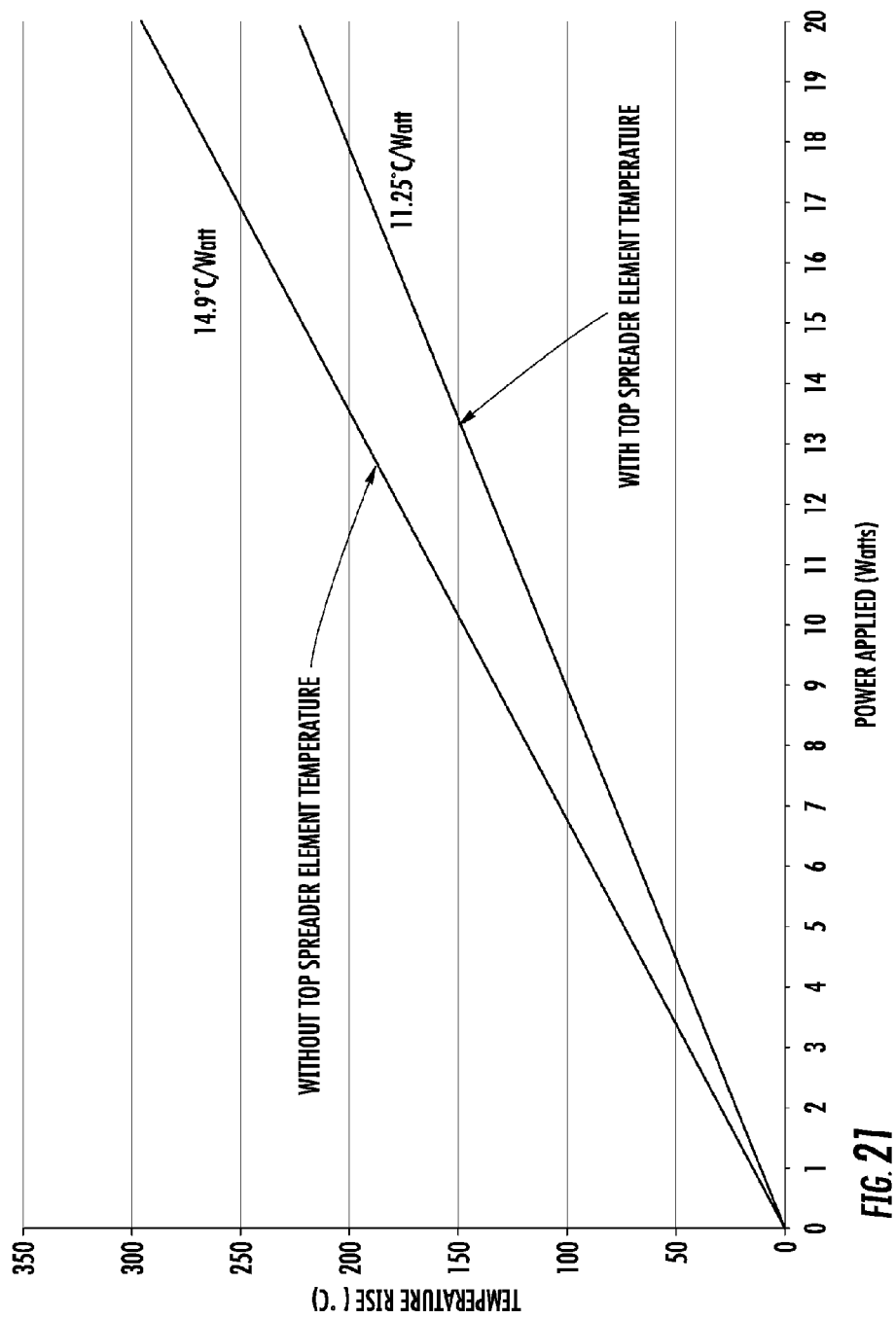
FIG. 21 is a graph comparing the performance of a resistive element without a heat spreader and a resistive element equipped with the present heat spreader.

As shown in the graph of FIG. 21, the present heat spreader 30 may significantly increase the heat dissipation for a resistive element 60 in a power package 50. Testing was conducted on a top mounted WSL Power Metal Strip Resistor, as described in U.S. Pat. No. 5,604,477 to Rainer et al., without any heat spreader, and a top mounted WSL Power Metal Strip Resistor having a heat spreader formed from copper that is approximately 0.17 inches wide and 0.01 inches thick, assembled as shown in FIGS. 1 and 2. Caledon CCD-120A50 material was used as the thermal interface material, with a first layer arranged between the resistor and the heat sink and a second layer arranged between the resistor and the heat spreader. The top mounted resistor without any heat spreader experienced a greater temperature rise than the top mounted resistor having the present heat spreader 30 at each level of applied power. During the test, power ranging from 0 to 20 watts was applied to each resistor configuration. While the top mounted resistor without any heat spreader experienced an average temperature increase of 14.9° C./Watt, the top mounted resistor having the present heat spreader 30 only experienced an average temperature increase of 11.25° C./Watt. The heat spreader 30 proved to be very effective at increasing heat dissipation by drawing heat from the resistive element into the heat sink.

Figure 3:
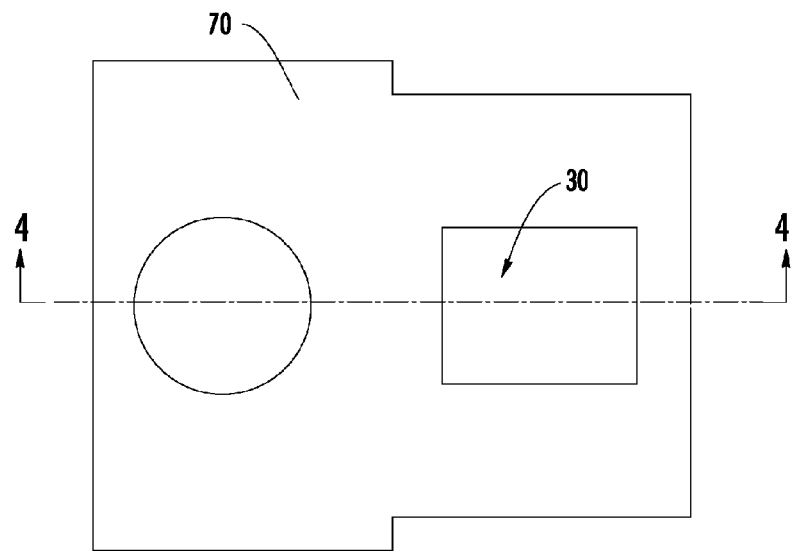
FIG. 3 is a top view of a second embodiment of the heat spreader mounted on a power package without the resistive element.
Figure 4:
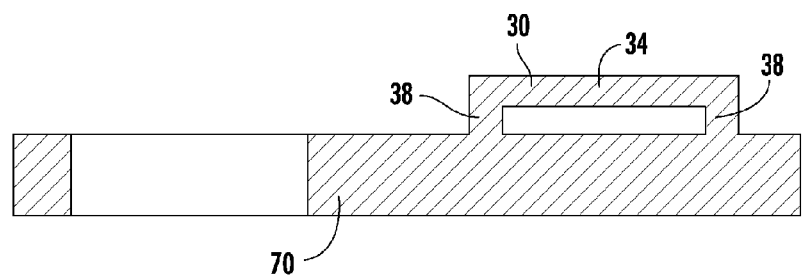
FIG. 4 is a sectional view taken along line 4-4 of FIG. 3.

While the heat spreader 30 shown in FIGS. 1 and 2 is formed as a separate component that is connected to the power package 50 after the resistive element 60 has been mounted on the heat sink 70, one of ordinary skill in the art would appreciate that the heat spreader 30 may also be attached to the heat sink 70 before the resistive element 60 is mounted, or be formed integrally with the heat sink 70. FIGS. 3 and 4 show a heat spreader 30 formed integrally with the heat sink 70 to form a resistor housing. The integral heat spreader 30 may be a subassembly separate from the heat sink 70 that is later made integral with the heat sink. Alternatively, the integral heat spreader 30 may be formed directly on the heat sink 70 through a punch and form process or through machining. Although two leg portions are shown, those of skill in the art would realize that one or more legs may be utilized without departing from the scope of the present inventions. The integral heat spreader 30 shown in FIGS. 3 and 4 includes a body portion 34 and two leg portions that extend from the body portion 34 to contact the heat sink 70. Having an integral heat sink 70 and heat spreader 30 is advantageous, as such an assembly strengthens the structural integrity of the power package and expedites assembly.

Figure 5:
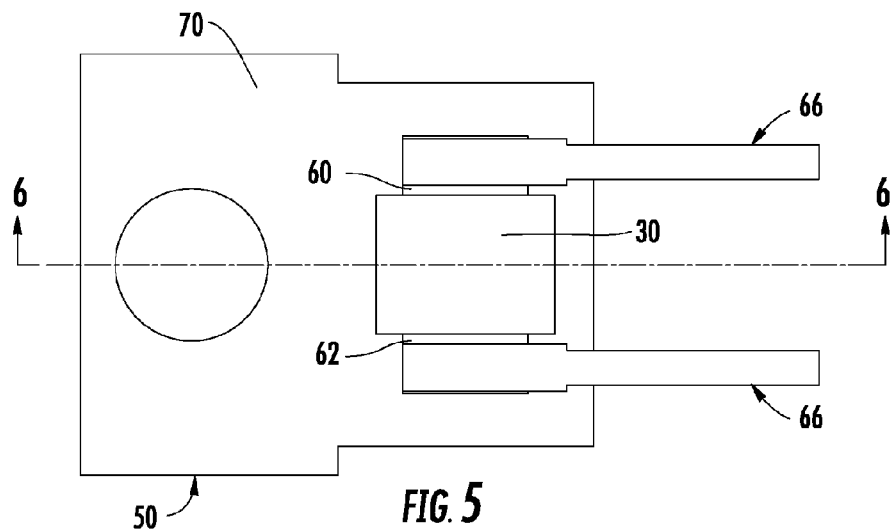
FIG. 5 is a top view of the second embodiment of the heat spreader mounted on a power package with the resistive element.
Figure 6:
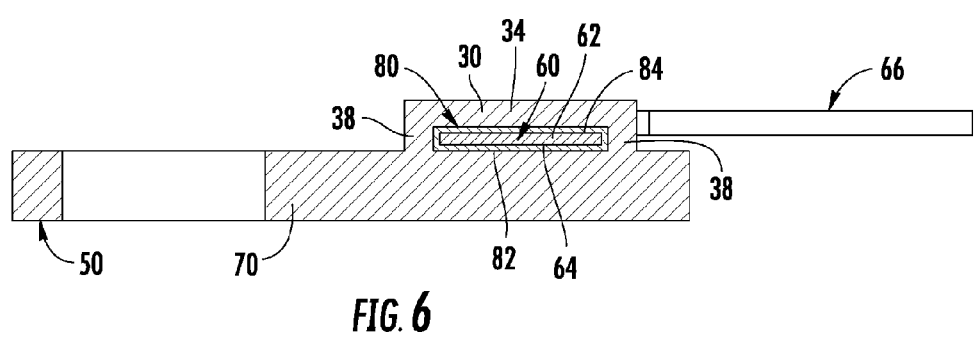
FIG. 6 is a sectional view taken along line 6-6 of FIG. 5.

As shown in FIGS. 5 and 6, a resistive element 60 may be mounted to a heat sink 70 that already includes a heat spreader 30. To ensure that the resistive element 60 is associated with the heat sink 70 and the heat spreader 30 in a thermally conductive but electrically non-conductive manner, a thermal interface material 80 (as discussed above with respect to FIGS. 1 and 2) is arranged in the space between the heat sink 70 and the heat spreader 30. As shown in FIG. 6, the thermal interface material 80 is preferably arranged to form a first layer 82 of thermal interface material 80 between the heat sink 70 and the bottom surface 64 of the resistive element 60, and a second layer 84 of thermal interface material 80 between the top surface 62 of the resistive element 60 and the body portion 34 of the heat spreader 30. For example and without limitation, the resistive element 60 may be arranged and held in place in the space between the heat sink 70 and the heat spreader 30, and the thermal interface material 80 is then injected to fill that space and surround the resistive element 60. The thermal interface material 80 preferably includes an adhesive to secure the resistive element 60 to the heat sink 70 and the heat spreader 30. After the resistive element 60 is mounted, a pair of electrical leads 66 may be connected to the top surface 62 of the resistive element 60. Where an integral heat spreader 30 is used, there is very little risk that the resistive element 60 would be torn from the heat sink 70 during a subsequent overmolding processing, as the integral heat spreader 30 provides a secure housing for the resistive element 60.

Figure 7:
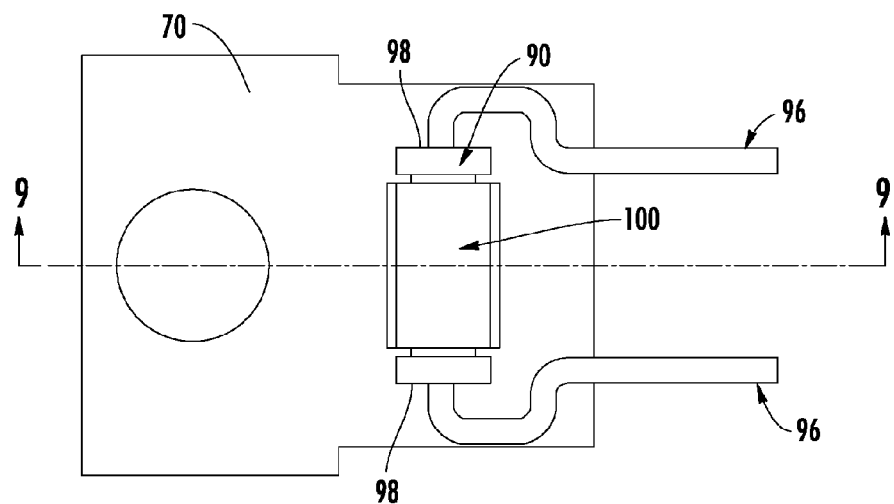
FIG. 7 is a top view of a third embodiment of the heat spreader mounted on a power package.
Figure 8:
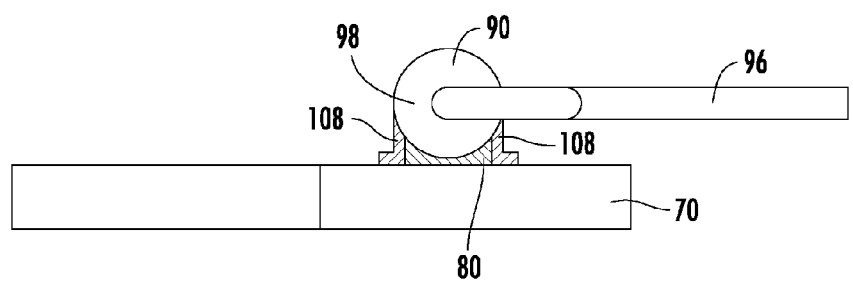
FIG. 8 is a left side elevational view of the heat spreader and power package shown in FIG. 7.
Figure 9:
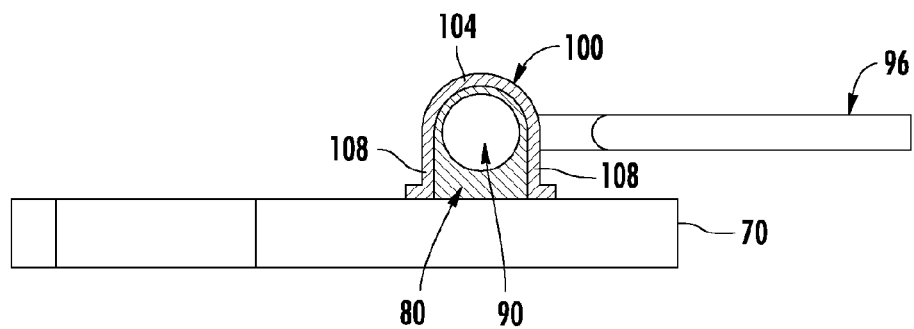
FIG. 9 is a sectional view taken along line 9-9 of FIG. 7.

As discussed above, one of ordinary skill in the art would appreciate that the resistive element 60 may have different shapes, dimensions, and configurations. While the resistive element 60 shown in FIGS. 1-2 and 5-6 has a substantially flat and rectangular body, FIGS. 7-9, 12-14, and 18-20 illustrate a resistive element having a substantially cylindrical body. FIGS. 7-9 show a cylindrical resistive element 90, such as an axial lead resistor, mounted on a heat sink 70 with a heat spreader 100 arranged over the resistive element 90. As discussed above with respect to the rectangular resistive element 60, the cylindrical resistive element 90 is preferably mounted to the heat sink 70 in a thermally conductive but electrically non-conductive manner to avoid shorting out the resistive element 90.

As shown in FIGS. 8 and 9, the resistive element 90 may be mounted to the heat sink 70 using a thermal interface material 80 containing an adhesive. The same thermal interface material 80 may also be used to provide a thermally conductive structural connection between the resistive element 90 and a heat spreader 100. Like the heat spreader 30 discussed above with respect to FIGS. 1-2 and 5-6, this heat spreader 100 also includes a central body portion 104 that extends between two leg portions 108. The body portion 104 and leg portions 108 of the heat spreader 100 are associated with the resistive element 90 through the thermal interface material 80, which is preferably arranged around the entire outer surface of the resistive element 90, so that heat from the resistive element 90 may be conducted into the heat spreader 100 and through the leg portions 108 into the heat sink 70. The leg portions 108 of the heat spreader 100 may be connected to the heat sink 70 through any suitable means, such as soldering. After the heat spreader 100 is arranged over the resistive element 90, a pair of electrical leads 96 may be connected to opposing axial ends 98 of the resistive element 90. Alternatively, the pair of electrical leads 96 may be connected to the opposing axial ends 98 of the resistive element 90 before the heat spreader 100 is arranged over the resistive element 90, or before the resistive element 90 is inserted in an integral heat spreader and heat sink assembly as described below with respect to FIGS. 15-17.

Figure 10:
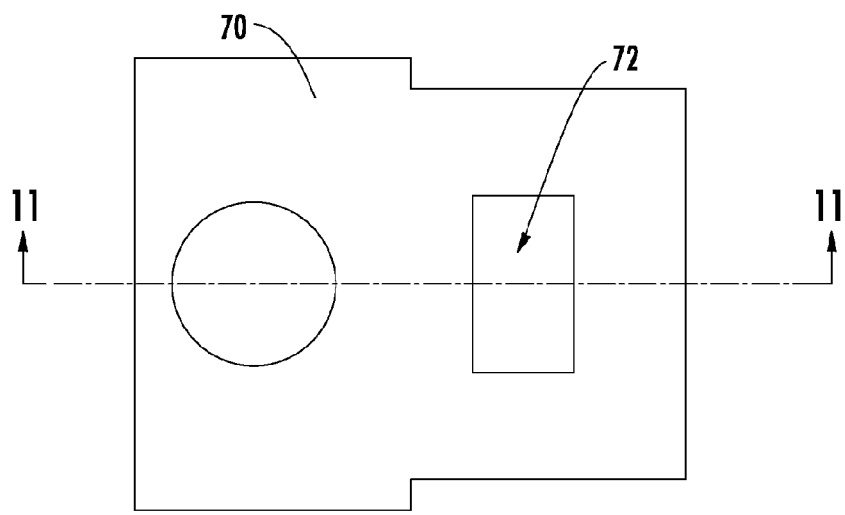
FIG. 10 is a top view of a heat sink having a seat for receiving a resistive element.
Figure 11:
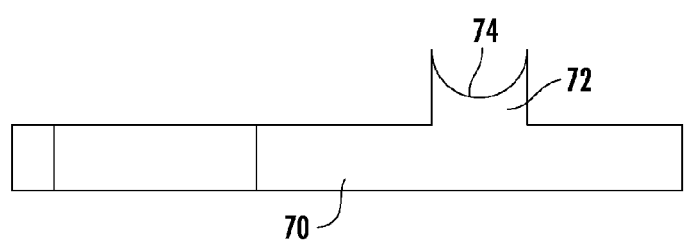
FIG. 11 is a sectional view taken along line 11-11 of FIG. 10.

To simplify and secure the mounting of the resistive element 90, the heat sink 70 may include a seat 72 shaped to receive a portion of the resistive element 90. As shown in FIGS. 10 and 11, the seat 72 may be formed integrally with the heat sink 70 and may include a curved saddle portion 74 that corresponds to the shape of the resistive element 90, so that the resistive element 90 may be easily mounted to the heat sink 70 without undesired movement. One of ordinary skill in the art would appreciate that the seat 72 may be shaped to accommodate various resistor shapes and sizes, and is not limited to the particular configuration shown in FIGS. 10 and 11.

Figure 12:
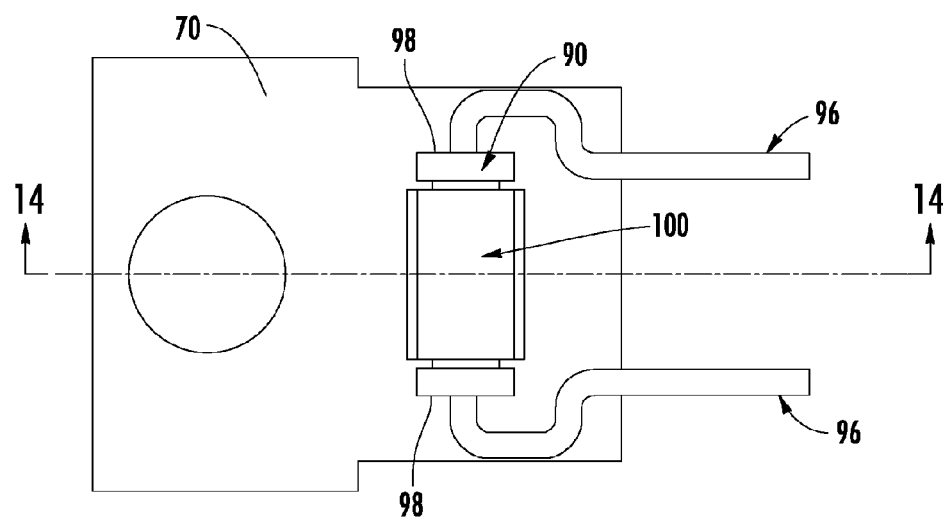
FIG. 12 is a top view of the third embodiment of the heat spreader and a resistive element mounted on the heat sink shown in FIG. 10.
Figure 13:
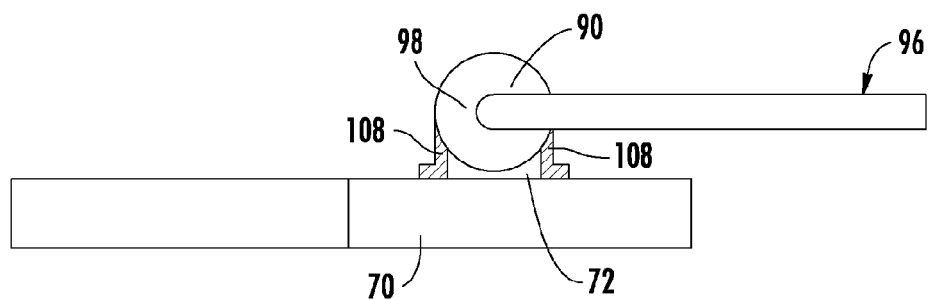
FIG. 13 is a left side elevational view of the heat spreader and power package shown in FIG. 12.
Figure 14:
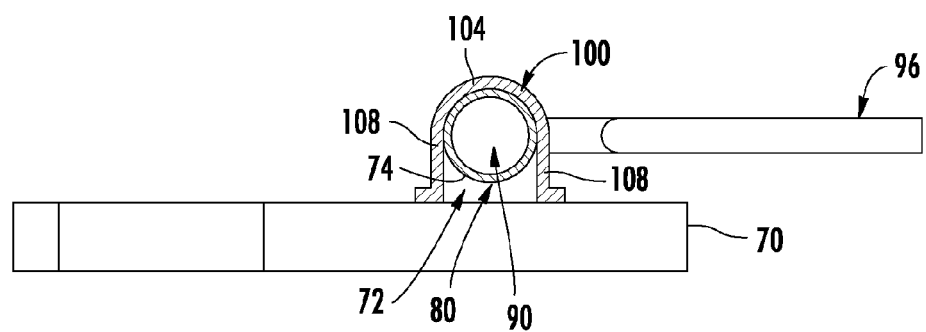
FIG. 14 is a sectional view taken along line 14-14 of FIG. 12.

FIGS. 12-14 show a resistive element 90 mounted to a heat sink 70 having a seat 72, with a heat spreader 100 arranged over the resistive element 90. As described above, the resistive element 90 may be connected to the seat 72 in a thermally conductive but electrically non-conductive manner using a thermal interface material 80 having an adhesive. The thermal interface material 80 may be dispensed on the curved saddle portion 74 of the seat before the resistive element 90 is positioned in the seat 72. The curved profile of the saddle portion 74 prevents the resistive element 90 from rolling on the heat sink 70 while the heat spreader 100 is associated with the resistive element 90 and the heat sink 70. As shown in FIG. 14, the seat 72 may be sized so that the two leg portions 108 of the heat spreader 100 contact opposing sides of the seat 72, which further aids in heat transfer from the heat spreader 100 to the heat sink 70.

Figure 15:
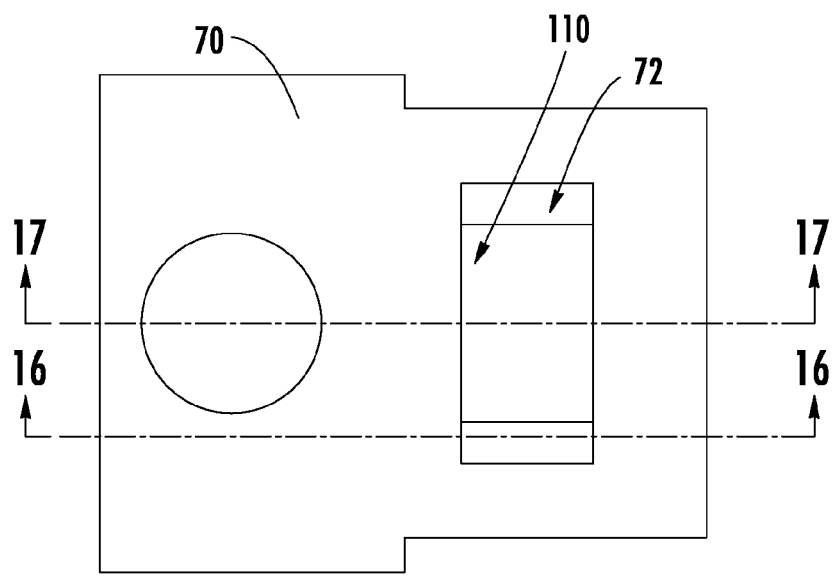
FIG. 15 is a top view of a fourth embodiment of the heat spreader mounted on a power package without the resistive element.
Figure 16:
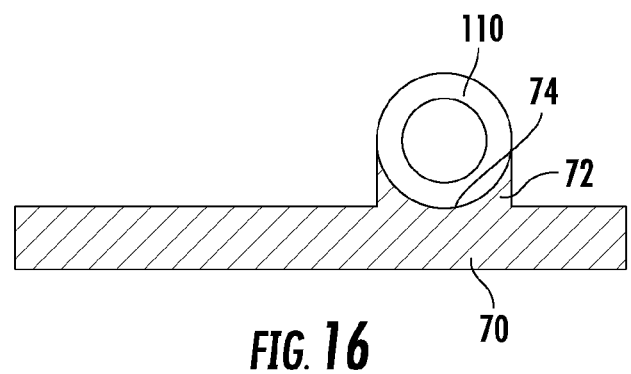
FIG. 16 is a sectional view taken along line 16-16 of FIG. 15.
Figure 17:
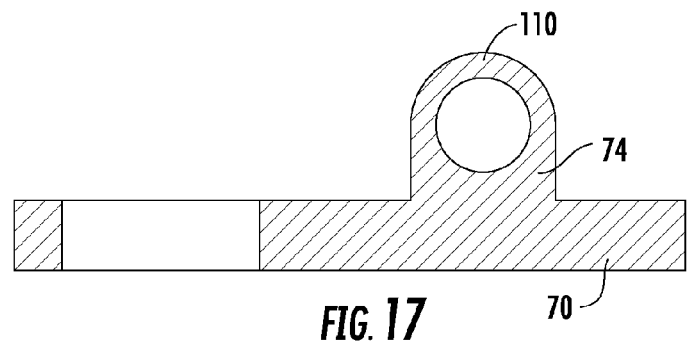
FIG. 17 is a sectional view taken along line 17-17 of FIG. 15.
Figure 18:
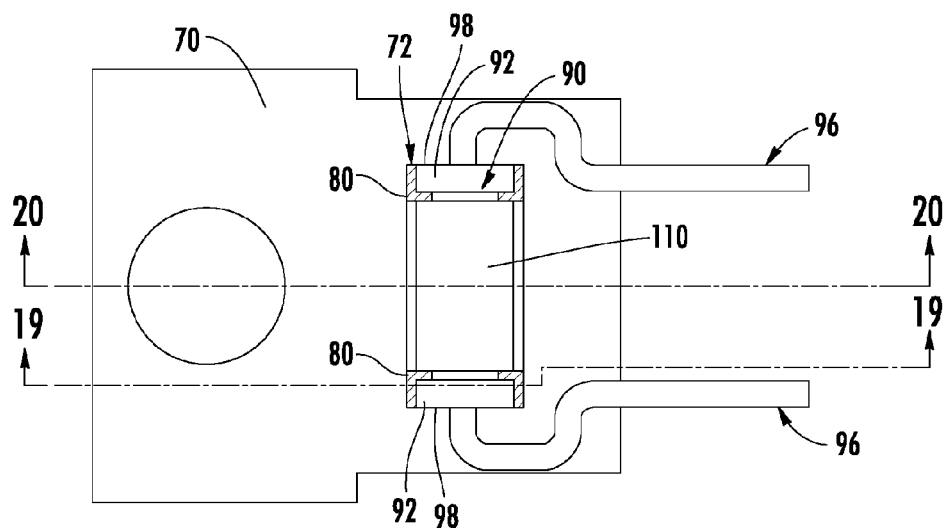
FIG. 18 is a top view of the fourth embodiment of the heat spreader mounted on a power package with the resistive element.
Figure 19:
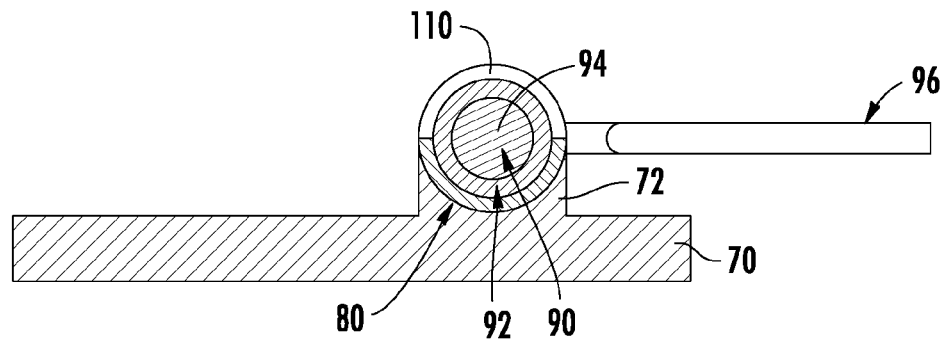
FIG. 19 is a sectional view taken along line 19-19 of FIG. 18.

As discussed above with respect to FIGS. 3 and 4, a heat spreader configured for a cylindrical resistive element 90 may also be attached to the heat sink 70 before the resistive element 90 is mounted to the heat sink 70, or be formed integrally with the heat sink 70. As shown in FIGS. 15-17, the heat sink 70 may include an integrally formed seat 72 and heat spreader 110. The heat spreader 110 may be formed as a cylindrical sleeve sized to receive a resistive element 90 and a thermal interface material 80. The heat spreader 110 may be positioned in the curved saddle portion 74 of the seat 72, and preferably has a smaller axial extent than the seat 72, so that end caps 92 of the resistive element 90 may also be supported by the seat 72, as shown in FIGS. 18 and 19. The heat spreader 110 may be connected to the seat 72 by any suitable method, and can be molded with the seat 72 and heat sink 70 to form an integral unit. Alternatively, the heat spreader 110 and seat 72 may be a subassembly separate from the heat sink 70 that is later made integral with the heat sink 70. The heat spreader 110 and seat 72 can also be formed directly on the heat sink 70 through a punch and form process, stamping, or machining.

Figure 20:
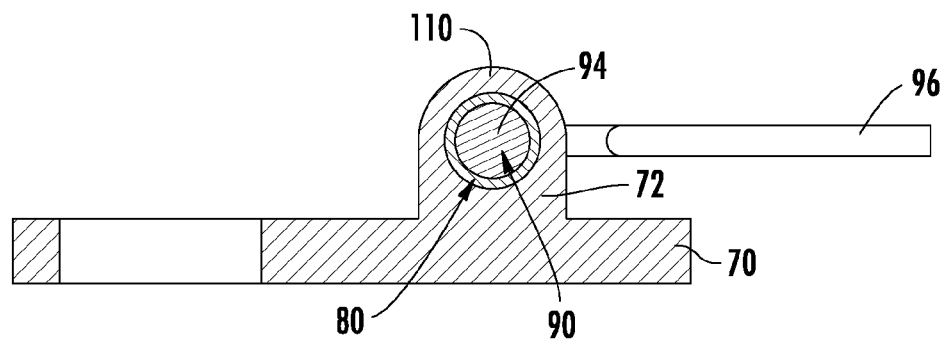
FIG. 20 is a sectional view taken along line 20-20 of FIG. 18.

As shown in FIGS. 18-20, a cylindrical resistive element 90 may be mounted to a heat sink 70 that includes an integral seat 72 and heat spreader 110. The resistive element 90 is inserted in the heat spreader 110 and held in place, and the thermal interface material 80 is injected to fill the space between the heat spreader 110 and the resistive element 90. As shown in FIG. 20, the thermal interface material 80 preferably surrounds the entire outer surface of the resistive element 90, so that heat from the resistive element 90 may be efficiently conducted into the heat spreader 110 and through the seat 72 into the heat sink 70.

Referring to FIGS. 18 and 19, the resistive element 90 may include two end caps 92 arranged at opposing axial ends of a main body portion 94 for connection to the electrical leads 96. The end caps 92 may each have a larger diameter than the main body portion 94 of the resistive element 90. Where the seat 72 of the heat sink 70 has a greater axial extent than the heat spreader 110, additional thermal interface material 80 may be dispensed on the curved saddle portion 74 of the seat 72 adjacent to the heat spreader 110, so that the end caps 92 are supported by the seat 72 and connected to the seat 72 in a thermally conductive manner. This configuration allows additional heat from the resistive element 90 to be dissipated through the end caps 92, which are not in thermal contact with the heat spreader 110, but are associated with and in thermal contact with the seat 72 of the heat sink 70.

A method for dissipating heat from a resistive element is also disclosed. The method includes the steps of providing a resistive element 60, 90, mounting the resistive element 60, 90 on a heat sink 70 in a thermally conductive relationship, and providing a heat spreader 30, 100 having a body portion 34, 104 and at least one leg portion 38, 108 that extends from the body portion 34, 104. The method further includes the steps of dispensing a thermal interface material 80 on a top surface of the resistive element 60, 90, as shown in FIGS. 2, 9, and 14, the thermal interface material 80 being any thermally conductive and electrically non-conductive material. The heat spreader 30, 100 is arranged over the resistive element 60, 90 so that the thermal interface material 80 is sandwiched between the body portion 34, 104 of the heat spreader 30, 100 and the top surface of the resistive element 60, 90.

The thermal interface material 80 may optionally include an adhesive to bond the heat spreader 30, 100 to the resistive element 60, 90. In addition, the thermal interface material 80 may be used to mount the resistive element 60, 90 on the heat sink 70. The two leg portions 38, 108 of the heat spreader 30, 100 may be connected to the heat sink 70 in a thermally conductive relationship through any suitable means. The method may further include the optional step of molding the heat spreader 30, 100, the resistive element 60, 90, and the heat sink 70 together. Alternatively, the heat spreader 30, 100 may be connected to the heat sink 70 and molded together into one integral unit before the resistive element 60, 90 is mounted, as discussed above with respect to FIGS. 3-6 and 15-20.

Having thus described the present heat spreader in detail, it is to be appreciated and will be apparent to those skilled in the art that many physical changes, only a few of which are exemplified in the detailed description above, may be made without altering the inventive concepts and principles embodied therein. It is also to be appreciated that numerous embodiments incorporating only part of the preferred embodiments are possible which do not alter, with respect to those parts, the inventive concepts and principles embodied therein. The present embodiments and optional configurations are therefore to be considered in all respects as exemplary or illustrative and not restrictive.

What is claimed is:

1. A heat spreader for a resistive element mounted on a heat sink, the heat spreader comprising:
    a single-piece body arranged over and covering a top surface of the resistive element and electrically insulated from the resistive element, the body comprising opposite ends forming legs on opposite sides of the resistive element extending toward and associated with the heat sink in a thermally conductive relationship;
    a thermal interface material comprising an adhesive bonding a top surface of the resistive element to the body and mounting the resistive element to the heat sink, the thermal interface material being thermally conductive and electrically non-conductive.

2. The heat spreader of claim 1, wherein the resistive element has a shape, and wherein the body conforms to the shape of the resistive element.

3. The heat spreader of claim 1, wherein the resistive element has a substantially rectangular body, and wherein the legs are positioned at an angle with respect to other portions of the body.

4. The heat spreader of claim 1, wherein the resistive element has a substantially cylindrical body, and wherein the body is curved about the substantially cylindrical body.

5. The heat spreader of claim 1, wherein the thermal interface material comprises solid particles having high thermal conductivity and low electrical conductivity.

6. The resistor and heat spreader assembly of claim 1, further comprising a pair of leads connected to opposite ends of the resistive element, the heat spreader being arranged between the pair of leads.

7. The resistor and heat spreader assembly of claim 6, wherein the top surface of the resistive element has an exposed area between the pair of leads that is covered substantially in its entirety by the heat spreader.

8. The resistor and heat spreader assembly of claim 1, wherein the thermal interface material includes spherical alumina or boron nitride particles.

9. The resistor and heat spreader assembly of claim 1, wherein the heat sink includes an integral seat that receives a portion of the resistive element.

10. The resistor and heat spreader assembly of claim 1, wherein the thermal interface material comprises a first layer bonding a top surface of the resistive element to the body and a second layer mounting a bottom surface of the resistive element to the heat sink.

11. The resistor and heat spreader assembly of claim 1, wherein the thermal interface material is arranged about the resistive element in a space provided between the body and the resistive element, and in a space provided between the heat sink and the resistive element.

12. A method for dissipating heat from a resistive element, the method comprising:
    mounting the resistive element on a heat sink via a thermal interface material comprising an adhesive, the thermal interface material being thermally conductive and electrically non-conductive;
    providing a heat spreader having a single-piece body, the body comprising opposite ends forming legs;
    positioning the legs on opposite sides of the resistive element;
    associating the legs with the heat sink in a thermally conductive relationship; and,
    bonding a top surface of the resistive element to the body via a thermal interface material comprising an adhesive, the thermal interface material being thermally conductive and electrically non-conductive.

13. The method of claim 12, further comprising the step of molding the heat spreader, the resistive element, and the heat sink together.

14. The method of claim 12, wherein the resistive element has a shape, and wherein the body corresponds to the shape of the resistive element.

15. The method of claim 12, wherein the step of bonding a top surface of the resistive element to the body comprises dispensing the thermal interface material on a top surface of the resistive element.

16. The method of claim 12, wherein the step of mounting the resistive element on a heat sink comprises arranging the thermal interface material between a bottom surface of the resistive element and the heat sink.

17. The method of claim 12, wherein the thermal interface material comprises solid particles having high thermal conductivity and low electrical conductivity.

18. The method of claim 12, further comprising connecting a pair of leads to opposite ends of the resistive element, the heat spreader being arranged between the pair of leads.

19. The method of claim 12, wherein the heat sink includes an integral seat that receives a portion of the resistive element.

* * * * *